United States Patent [19]

Gotou

[11] Patent Number: 5,001,526
[45] Date of Patent: Mar. 19, 1991

[54] DRAM CELL FORMED ON AN INSULATING LAYER HAVING A BURIED SEMICONDUCTOR PILLAR STRUCTURE AND A MANUFACTURING METHOD THEREOF

[75] Inventor: Hiroshi Gotou, Niiza, Japan

[73] Assignee: Fujitsu Limited, Kawasaki, Japan

[21] Appl. No.: 268,185

[22] Filed: Nov. 7, 1988

[30] Foreign Application Priority Data

Nov. 10, 1987 [JP] Japan ............................ 62-283839

[51] Int. Cl.⁵ ............................................ H01L 29/68
[52] U.S. Cl. ................................. 357/23.6; 357/23.4; 357/49
[58] Field of Search ....................... 357/23.6, 49, 23.4, 357/45

[56] References Cited

U.S. PATENT DOCUMENTS

| | | | |
|---|---|---|---|
| 4,462,040 | 7/1984 | Ho et al. | 357/23.4 |
| 4,630,088 | 12/1986 | Ogura et al. | 357/23.4 |
| 4,660,068 | 4/1987 | Sakuma et al. | 357/49 |
| 4,769,786 | 9/1988 | Garnache et al. | 357/23.6 |
| 4,830,978 | 5/1989 | Teng et al. | 357/23.6 |

FOREIGN PATENT DOCUMENTS

| | | | |
|---|---|---|---|
| 0198590 | 10/1986 | European Pat. Off. | |
| 0217288 | 4/1987 | European Pat. Off. | 357/49 |
| 53-45675 | 12/1978 | Japan | 357/49 |
| 61-73366 | 4/1986 | Japan | |
| 63-66963 | 3/1988 | Japan | |

OTHER PUBLICATIONS

Richardson et al., "A Trench Transistor Cross-Point DRAM Cell," 1985, *IEDM Tech. Dig.*, pp. 714–717.
J. B. Lasky et al., "Silicon-On-Insulator (SOI) by Bonding and Etch-Back", IEDM Tech. Dig. 1985, pp. 684–687.
C. G. Jambotkar, "Methods to Fabricate Very Dense Arrays of Dynamic Ram Cells" *IBM Technical Disclosure Bulletin*, vol. 24, No. 8, Jan. 1982, pp. 4239–4243.

*Primary Examiner*—Andrew J. James
*Assistant Examiner*—Courtney A. Bowers
*Attorney, Agent, or Firm*—Staas & Halsey

[57] ABSTRACT

A DRAM cell structure and a manufacturing method thereof as disclosed, in which a transistor and a capacitor are formed three-dimensionally in an SOI structure. The substrate having the SOI structure is fabricated by bonding two silicon substrates sandwiching a silicon oxide layer therebetween. A plurality of pillars of silicon layers arranged in a matrix array is formed in the SOI structure by forming a trench in the silicon layers of the SOI. The lower portion of the pillar is used as a storage electrode of the capacitor and the upper portion, as active regions of the vertical transistor. In the trench, doped polysilicon is filled in a lower portion and functions as a cell plate of the capacitor, with a dielectric film being formed on the pillar surface. A gate insulating film and a gate electrode thereon are formed on the upper side surface of the pillar. The gate electrode is self-aligned, connected in the Y-direction but separated in the X-direction, and functions as a word line. A connecting line of the upper active region of the transistor functions as a bit line. Only two mask processes are needed in fabricating the DRAM cell, and isolation between adjacent cells is excellent in spite of a small cell area.

9 Claims, 6 Drawing Sheets

DRAM CELL FORMED ON AN INSULATING LAYER HAVING A BURIED SEMICONDUCTOR PILLAR STRUCTURE AND A MANUFACTURING METHOD THEREOF

BACKGROUND OF THE INVENTION

1. Field of the Invention

This invention relates to a dynamic random access memory (hereinafter, abbreviated as DRAM) cell structure of a one-transistor and capacitor type and a manufacturing method thereof. More specifically, this invention relates to a DRAM cell structure suitable for obtaining a memory capacity equal to or more than 4 Mbits. The present invention is intended to reduce a cell area, simplify fabrication processes by minimizing a number of necessary mask steps and increase reliability through better isolation between adjacent cells.

2. Description of the Related Art

With increasing memory capacity, a cell structure of the DRAM device has a tendency to adopt a three-dimensional form rather than a planar form. For example, a device having one-transistor and a capacitor formed vertically in a deep trench is disclosed at IEDM 85 (1985 IEEE International Electron Device Meeting): "A trench transistor cross-point DRAM cell" by W. F. Richardson et al. IEDM Tech. Dig. 1985, pp. 714-717.

Figure 1A:
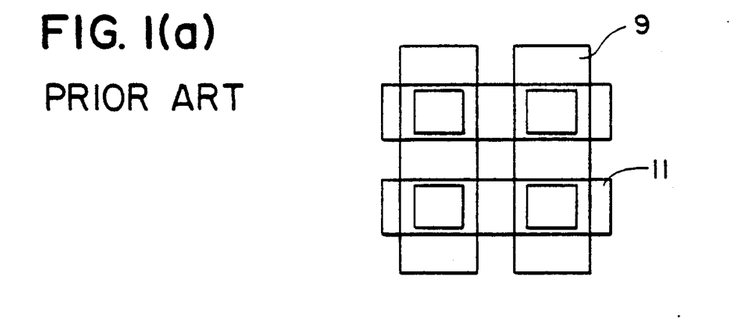
FIGS. 1(a) and 1(b) are a top view and a cross-sectional view, respectively, of a known DRAM cell structure, in which a cell capacitor is formed deep in a trench and under a vertical transistor.
Figure 1B:
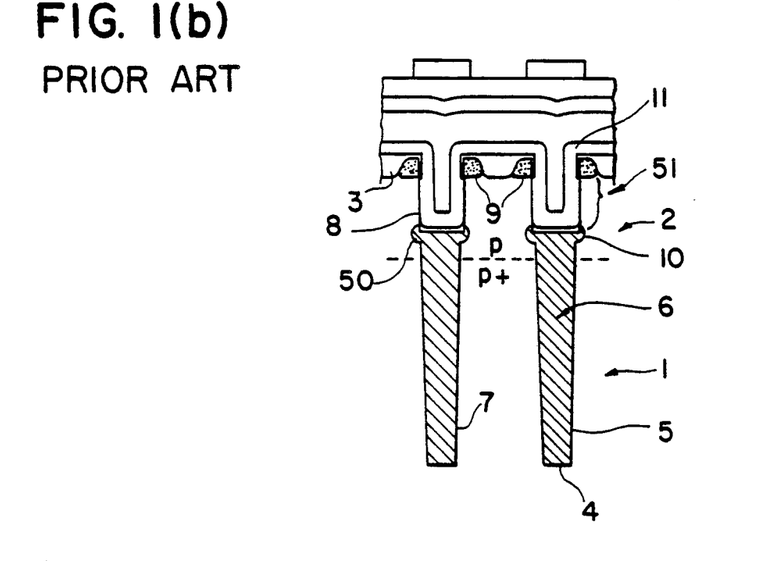

FIG. 1(a) is a top view of the cell layout and FIG. 1(b), a cross section of the DRAM cell disclosed above. A p-type epitaxial layer 2 is grown on a p+-type substrate 1. A recessed oxide isolation 3 and n+-type diffusion region 9 are formed around a trench 4. Diffusion region 9 functions as a drain of the vertically formed NMOS transistor 51 and the drain is mutually connected with adjacent drains arranged in the Y-direction of rectangular coordinates, forming a bit line. After forming the trench 4, a capacitor dielectric film 5 is formed on an inner wall of the trench and the trench is filled with phosphorous doped polysilicon. The doped polysilicon is etched back leaving a storage electrode 6.

A trench wall around the top of the storage electrode 6 is partially etched and removed, and a buried lateral contact 10 of polysilicon is deposited therein. The buried lateral contact 10 is later subjected to a thermal diffusion of phosphorous impurities from the storage electrode 6 and serves as a source of the vertical NMOS transistor 51. Thereafter, a gate oxide film 8 is formed by thermal oxidation on an inner cylindrical wall of the trench. A thicker oxide layer 50 is formed on the top of the storage electrode 6 by the thermal oxidation process. Finally, a word line 11, which functions as a gate of the NMOS transistor 51, is formed by depositing and patterning the phosphorous doped polysilicon or aluminum alloy.

In FIG. 1(b), a capacitor is composed of the storage electrode 6 and the surrounding substrate portion thereof. The dielectric film 5 is sandwiched therebetween. The above substrate portion surrounding the trench is used as the common capacitor electrode for all cells and is called a cell plate 7.

When an information bit is input through the bit line 9 to a specific cell which is addressed by the word line 11, the NMOS transistor 51 becomes conductive and electric charges are stored in the capacitor. The structure of FIGS. 1(a) and 1(b) utilizes a capacitor which is formed deep in the trench below the transistor. Therefore, the effective capacitance of the memory cell can be easily increased with increasing depth of the trench within a limited cell area, resulting in a high integration density DRAM.

However, the above structure has problems such that the recessed oxide isolation 3 requires a specified distance between neighboring diffusion regions 9, thus limiting an achievable minimum gap distance between cells. Further, if a short gap between cells is selected, a punch-through phenomenon between diffusion regions 9 (drain) may occur, thus resulting in a memory failure or information error.

Figure 2:
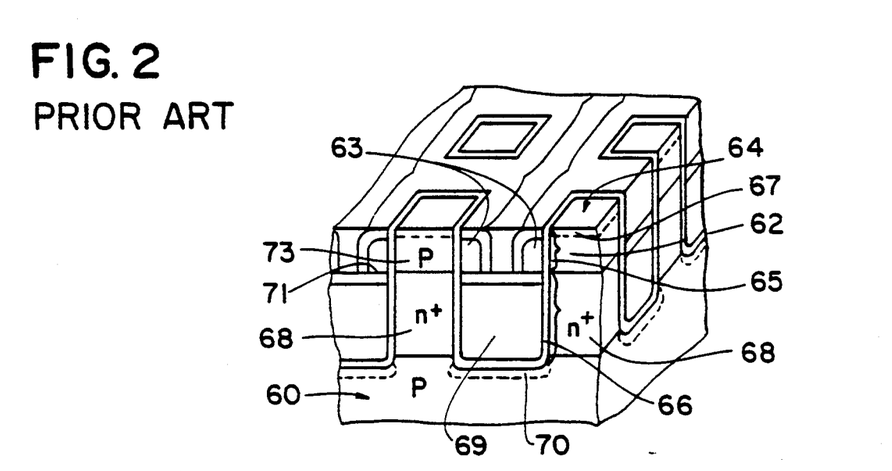
FIG. 2 is a schematic perspective view of another known DRAM cell structure.

An improved structure for a DRAM is disclosed by K. Minegishi, T. Morie, and et al in Japan Unexamined Patent Publication SHO-63-66963 dated Mar. 25, 1988. FIG. 2 herein shows a schematic perspective view of the structure of the Minegishi et al. type DRAM, wherein two sectional views in two directions are illustrated taken along the X-axis and Y-axis. The vertical NMOS transistor 62 is formed in an isled pillar region 64 on a p-type substrate 60. The pillar region is surrounded by insulating layers 65 and 66. The NMOS transistor 62 comprises an n+-type drain 67, and an n+-type source occupying a top portion of an n+-type epitaxial layer 68. A gate electrode 63 is formed outside the isled pillar region 64 insulated by a gate insulating layer 65, and functions as a word line. In FIG. 2, a bit line, formed on a top of the isled region 64 and connecting plural drains 67 in the X-direction, has been omitted. A capacitor is composed of the n+-type epitaxial layer 68 (called a storage electrode), a doped polysilicon 69 (called a cell plate), and the insulating layer 66 sandwiched therebetween.

As seen in FIG. 2, a p+-type isolation region 70 is required which is formed by boron ion implantation in a p-type substrate 60. The isolation region 70 should be formed at the lower portion of the trench before it is buried with the doped polysilicon 69. A high impurity concentration is required for the isolation region 70 to eliminate leakage of electric charges between adjacent storage electrodes 68. This is due to the fact that the cell plate (doped polysilicon 69) easily induces an inversion layer on an opposite bottom surface of the insulating layer 66.

The above DRAM structure has a problem in that a level of the lower surface 71 of the gate electrode 63 should be formed substantially equal to an interface level between the n+ epitaxial layer 68 and p-type epitaxial layer 73 where the channel region and drain 67 of NMOS transistor 62 are formed.

Due to the above two factors, i.e., formation of the isolation region 70 and level matching, the fabrication of this type of DRAM is relatively difficult. Also, a sufficient degree of reliability is difficult to obtain.

SUMMARY OF THE INVENTION

An object of the present invention, therefore, is to provide a cell structure suitable for obtaining a 4 Mbit or 16 Mbit DRAM device and a manufacturing method thereof Another object of the present invention is to provide a DRAM cell structure having the above-stated memory capacity within a minimum chip area such as the area required for a conventional 1 Mbit or 256Kbit DRAM device.

Still another object of the present invention is to provide a DRAM cell structure which minimizes interference from adjacent cells.

Yet another object of the invention is to provide a manufacturing method of a DRAM cell structure fabricated with a minimum number of mask steps, thereby simplifying and shortening existing manufacturing processes.

The foregoing and related objects are accomplished by providing a DRAM cell structure in which one-transistor and a capacitor are formed three-dimensionally in a silicon-on-insulator (SOI) structure. The source, drain and channel regions of a MOS FET and a first electrode (a storage electrode) of a capacitor are vertically formed in a pillar structure on the insulating layer of the SOI and covered with a surrounding insulating film. The pillar structure is surrounded and buried with a second electrode of the capacitor (called a cell plate which is a common electrode to all memory cells). A gate electrode of the MOS FET is formed above the cell plate surrounding the channel region of the MOS FET.

All active elements in the semiconductor pillar structure, such as the source and drain regions, the channel region and the storage electrode, are completely isolated from neighboring cells. The punch-through phenomenon between diffusion regions 9, explained with reference to the structure of FIG. 1(b) is avoided, and thus, the isolation region 70 illustrated in FIG. 2 becomes unnecessary.

Other objects and advantages of the present invention will become apparent from the detailed description to follow taken in conjunction with the appended claims.

BRIEF DESCRIPTION OF THE DRAWINGS

FIGS. 4(a) and 4(b) through 14(a) and 14(b), schematically illustrate successive steps of a method according to the present invention for fabricating the DRAM cell shown in FIGS. 3(a) and 3(b);

DETAILED DESCRIPTION OF THE PREFERRED EMBODIMENTS

Figure 3A:
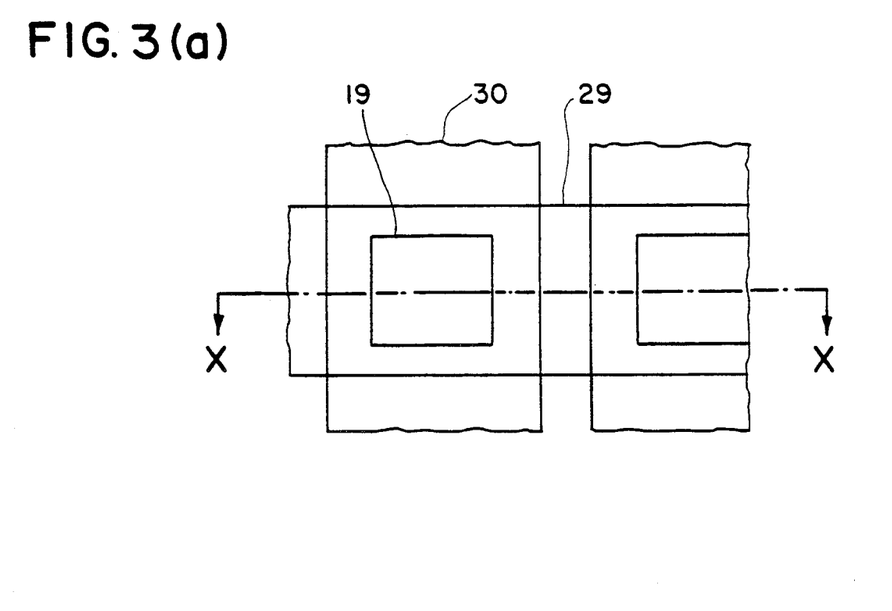
FIGS. 3(a) and 3(b) are a top view and a cross-sectional view, respectively, of the DRAM cell structure according to a first, preferred embodiment of the present invention.
Figure 3B:
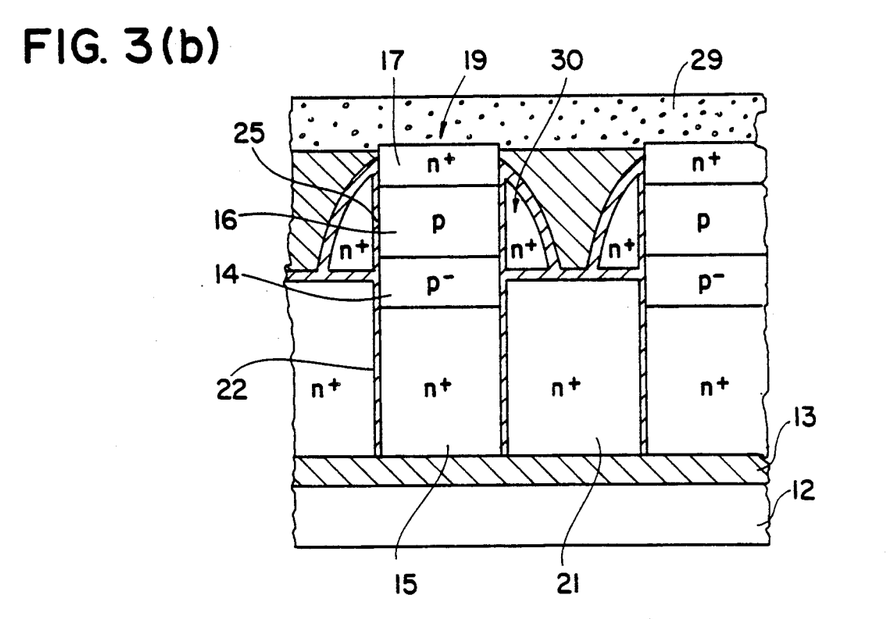

FIGS. 3(a) and 3(b) show respectively a top view and a cross-sectional view taken along line X—X of a DRAM cell structure in which a first preferred embodiment of the present invention is applied.

A silicon substrate 12 has an insulating layer 13 of silicon dioxide formed thereon. A semiconductor pillar 19 is formed on the insulating layer 13 and includes a first n-type high impurity concentration layer 15 (hereinafter referred to as a first n+ layer), a p-type low impurity concentration layer 14 (hereinafter referred to as a p⁻ layer), p-type channel layer 16, and a second n+ layer 17, arranged in order from the bottom. The first n+ layer 15 functions as a storage electrode and the second n+ layer 17 as a drain region of a MOS FET.

A lower portion of the sides of the pillar 19 is covered with a dielectric film 22. The corresponding portion of the gap between the pillars is filled with a n+ polysilicon 21, which functions as a cell plate, and forms a capacitor in conjunction with the storage electrode 15 and the dielectric film 22.

A gate electrode 30 of doped polysilicon is formed in an upper portion of the gap between pillars, and surrounds the pillar 19 at a corresponding height of the p-type channel layer 16 in the pillar. The gate electrode 30 is insulated from the pillar by a gate insulating film 25. The plural gate electrodes 30, which are aligned in the Y-direction, are mutually connected with each other and collectively form a word line. However, each word line is separate and insulated from adjacent word lines.

On a top of the cell structure, a bit line 29 of aluminum or aluminum allow is formed connecting the second n+ layers 17 in a X-direction.

In the embodiment described above, the NMOS FET is formed vertically in an upper portion of the cell and the capacitor is buried below the NMOS FET; thus, the cell structure is formed three-dimensionally, and the surface area occupied by each memory cell is remarkably reduced. Each memory cell is isolated from adjacent memory cells. Each active element is covered with either an insulating film or a thick insulating layer, except the cell plate 21 which is utilized as a common electrode for all memory cells. Therefore, the punch-through failure experienced by some of the known devices is avoided, and reliability in storing information is greatly increased.

Further details of the structure of the above embodiment and a manufacturing method thereof are explained with reference to FIGS. 4 through 14.

Figure 4A:
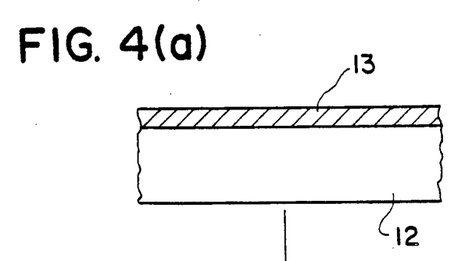
Figure 4B:
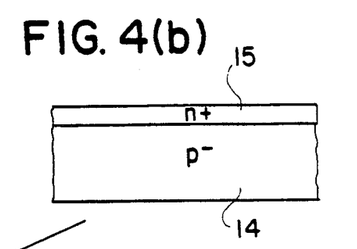
Figure 5:
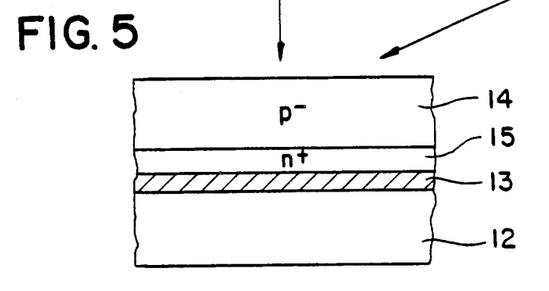

As shown in FIGS. 4(a) and 4(b), two silicon substrates [p-type Si(100)] are formed in a first step by subjecting the first silicon substrate 12 to thermal oxidation, thereby forming a silicon dioxide ($SiO_2$) layer 13 with a thickness of about 0.5 micron on the substrate. An n+-type epitaxial layer 15 having an impurity concentration of $1.0 \times 10^{20}$ cm$^{-3}$ is grown on a second silicon substrate 14 and has a thickness of about 5 microns. The two substrates 12 and 14 are brought together, with silicon substrate 14 being inverted so that the n+-type epitaxial layer 15 contacts the $SiO_2$ layer 13 as shown in FIG. 5. A bonding technique is then applied to the two silicon substrates, between which the $SiO_2$ layer 13 is disposed.

Though bonding techniques are generally known, there have been many accompanying problems therewith in terms of practical applications. Recently, improvements in silicon-on-insulator (SOI) bonding techniques have been made. The following document discloses one such bonding technique, the disclosure of which is incorporated herein by reference: "Silicon-On-Insulator (SOI) by Bonding and Etch-back" by J. B. Lasky et al. IEDM Tech. Dig. 1985, pp. 684–687.

In the present embodiment, the following SOI technique is applied. In order to achieve a firm bonding between the two silicon substrates with a $SiO_2$ layer sandwiched therebetween, an electrostatic pressure bonding method is applied. An electric pulse having a voltage, such as about 300 Volts (a preferred range is between 100 to 500 Volts), is applied between two substrates, thereby heating the substrate to about 800° C. in an inert gas (nitrogen) atmosphere. The time required for the application of electric pulse is about a few minutes, during which the substrates are subjected to a strong electrostatic attracting force. Thereafter, the substrates are annealed at a temperature of 1100° C. for about 30 minutes in the inert gas atmosphere.

After bonding, the surface of the substrate 14 is subject to polishing and lapping processes until the total height of the n+-type epitaxial layer 15 and the remaining substrate 14 is brought to about 8 microns.

Figure 6:
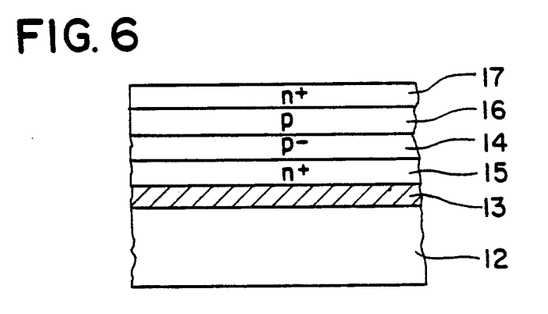

The substrate (hereinafter, the bonded two substrates are briefly called the substrate) is subjected to boron and subsequently arsenic ion implantation processes, and thereafter annealed at about 1000° C. These processes result in forming four layers on the $SiO_2$ layer 13 as shown in FIG. 6. Four layers are composed of (1) a second n+ layer, hereinafter, called a drain diffusion layer 17 having an impurity concentration of $1.0 \times 10^{20}$ $cm^{-3}$ and a thickness of about 0.4 microns, (2) a p-type channel layer 16 having an impurity concentration of $1.0 \times 10^{16} cm^{-3}$ and a thickness of about 1.6 microns, (3) a p-type original substrate layer 14 (hereinafter briefly called the p−layer 14), having an impurity concentration of $1.0 \times 10^{15}$ $cm^{-3}$ and a thickness of about 1.0 microns, and (4) the original epitaxial layer 15 having an n-type impurity concentration of $1.0 \times 10^{20} cm^{-3}$ and a thickness of about 5.0 microns.

Figure 7A:
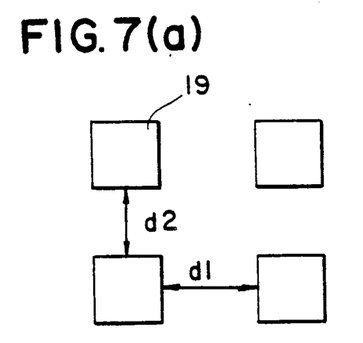
Figure 7B:
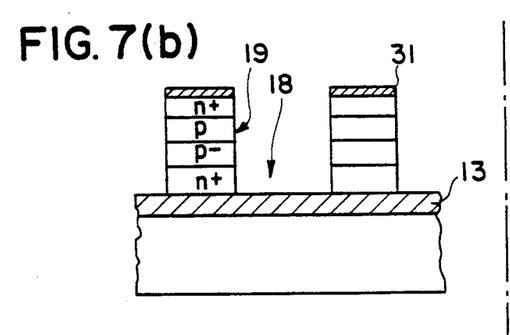

Next, a CVD (Chemical Vapor Deposition) $SiO_2$ layer and a resist layer (these are not shown in the figure) are formed on the substrate surface, and the resist layer is photolithographically patterned. The exposed CVD $SiO_2$ layer is etched away leaving a mask of CVD $SiO_2$ layer 31 in FIG. 7(b) and thereby forming a trench. The substrate is then subjected to an anisotropic etching process such as RIE (Reactive Ion Etching). As shown in FIG. 7(b), deep trenches 18 are formed leaving a plurality of semiconductor pillars 19 on the $SiO_2$ layer 13, the pillars being arranged in positions forming a matrix array, and each pillar having a cross section of about 0.7 microns by 0.7 microns. The gap d1 between pillars in the X-direction is greater than that (d2) in the Y-direction as shown in a top view of FIG. 7(a). In one particular embodiment, d1 is selected to be about 1.1 microns, and d2 about 0.7 microns.

Figure 8:
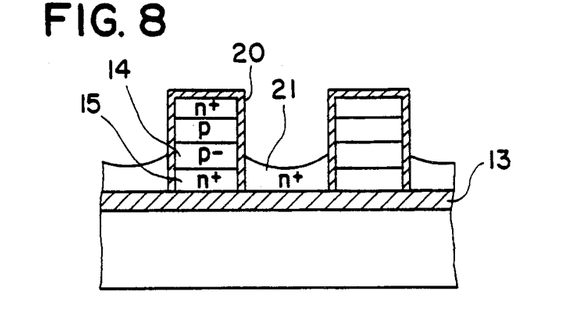
Figure 9A:
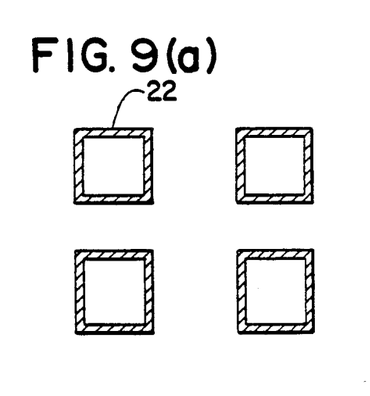
Figure 9B:
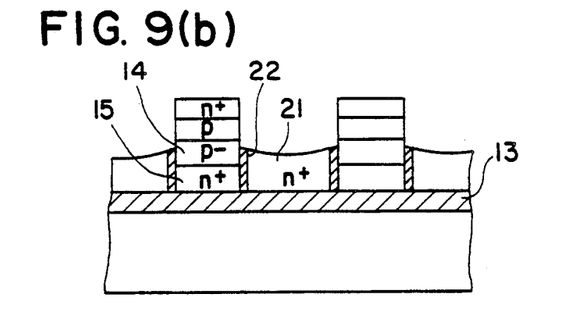

After removing the mask layer 31 of CVD $SiO_2$, the substrate is thermally oxidized forming a $SiO_2$ film 20 (FIG. 8) on the pillar surfaces. The $SiO_2$ film 20 has a thickness of 120 angstroms and serves as a dielectric film 22 between capacitor electrodes. As shown in FIG. 8, the trenches are partially filled with doped CVD polysilicon. A monosilane ($SiH_4$) or dichlorosilane ($SiH_2Cl_2$) gas and a phosphine ($PH_3$) gas are used as a source and additive gas, respectively. The phosphorus impurity concentration of this process is about $1.0 \times 10^{21}$ $cm^{-3}$. Other methods of impurity doping, such as an ion implantation method, can be utilized. The excess polysilicon is etched back, controlling a surface level of the remaining doped polysilicon layer 21 to correspond to within the height level of p− layer 14. Thereafter, the exposed $SiO_2$ film 20 is removed and the structure shown in FIGS. 9(a) and 9(b) is obtained. The doped polysilicon layer 21 and the n+ layer 15 are also called respectively a cell plate and a storage electrode of the capacitor.

Figure 10:
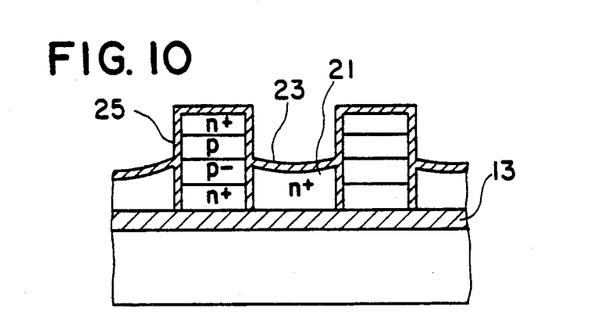

As shown in FIG. 10, the substrate is again thermally oxidized, and a gate $SiO_2$ film 25 is newly formed having a thickness of about 200 angstroms. In this process, a thick $SiO_2$ layer 23 having a thickness of about 400 angstrom is formed on the doped polysilicon layer 21.

Figure 11A:
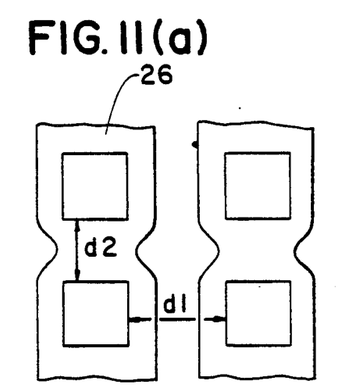
Figure 11B:
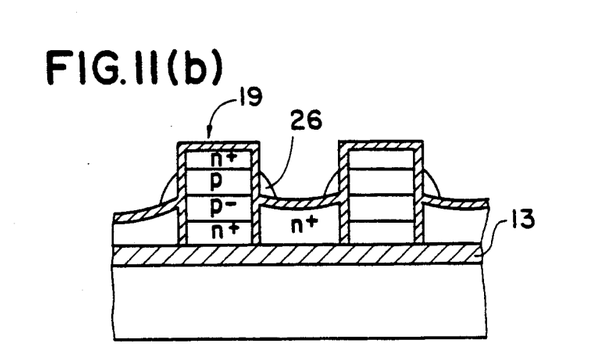

Next, in the similar way as depositing doped polysilicon layer 21, a phosphorus doped polysilicon layer, with (an impurity concentration of $1.0 \times 10^{21}$ $cm^{-3}$) is grown on the substrate by a CVD method, and is etched back leaving a doped polysilicon layer 26 on upper sides of the pillar 19 by a RIE method. The remaining polysilicon layer 26 has a thickness which becomes progressively thicker from a top position of the pillar. As explained previously, the gap between the pillars is set up differently, d1 being larger than d2 in FIG. 11(a). Therefore, the grown polysilicon layer 26 is separated and isolated completely in the X-direction after the etch back process. However, the grown polysilicon layer remains continuous between the gaps in the Y-direction as shown in a top view of FIG. 11(a). The doped polysilicon layer 26 functions as a gate electrode of the vertical MOS FET, and a plurality of gate electrodes in the Y-direction is automatically connected and works as a word line of the DRAM device.

Figure 12:
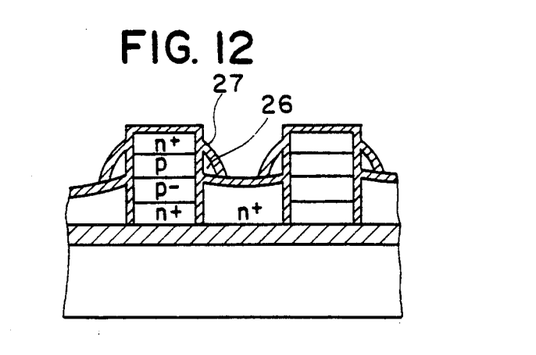
Figure 13:
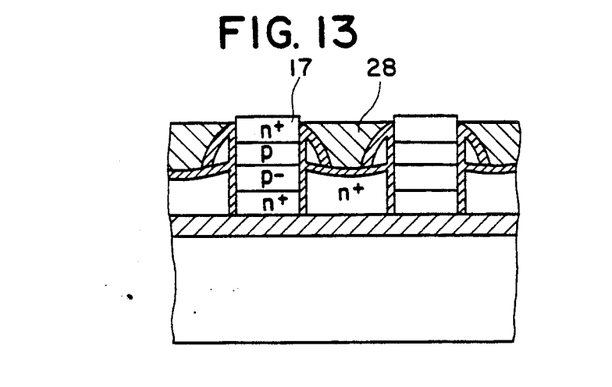

As shown in FIG. 12, the surface of the doped polysilicon layer 26 is thermally oxidized forming a $SiO_2$ layer 27. Thereafter, the entire surface of the substrate is deposited with phospho-silicate-glass (PSG) by a CVD method. The deposited PSG layer 28 is then etched back until the surface of the drain diffusion layer 17 of the semiconductor pillar is exposed and shows a flat surface with the leveled PSG layer 28 as seen in FIG. 13.

Figure 14A:
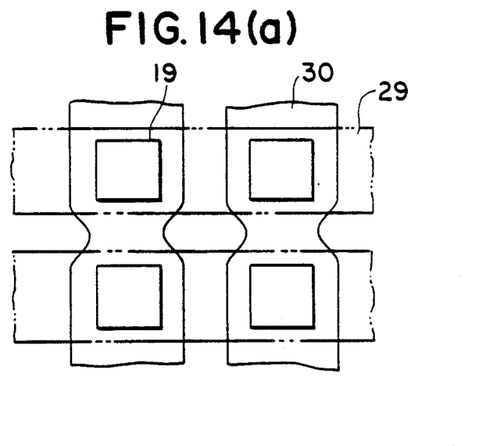
Figure 14B:
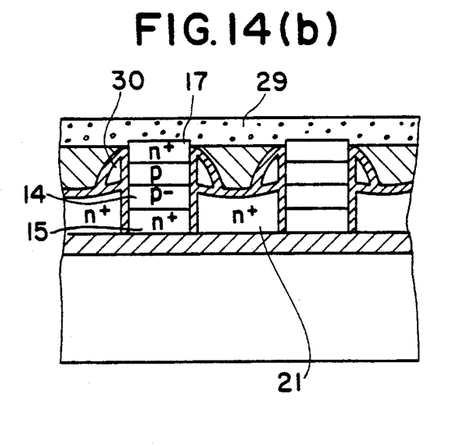

An aluminum or aluminum alloy layer is deposited on the entire surface of the substrate, and is patterned photolithographically, forming a bit line 29 which connects plural drain diffusion layers 17 in the X-direction. The final cell structure, shown in FIGS. 14(a) and 14(b), is similar to that which is shown in FIGS. 3(a) and 3(b).

In the manufacturing method of the above embodiment, only two mask processes are required. The first mask process is applied in the step of forming the semiconductor pillars 19 as explained with reference to FIGS. 7(a) and 7(b). The second mask process is applied in the step of forming a bit line. Other elements of the cell structure are automatically self-aligned. Therefore, the manufacturing method of the present invention is very effective to shorten the required fabrication time and to achieve a high yield. Further, the number of times required to prepare a mask alignment tolerance is reduced, which is necessary for each mask step after the first mask step, with a result of making a very fine cell structure possible.

In the above embodiment, the p-type channel layer 16 and the p− layer 14 are formed vertically in the semiconductor pillar 19. This is because, even when the upper surface level of the cell plate changes between the upper and lower surface levels of the p− layer 14, the channel length of the MOS FET is predominantly controlled by the thickness of the p-type channel layer 16 only. Fluctuation of the channel length is thus reduced to a minimum.

Figure 15A:
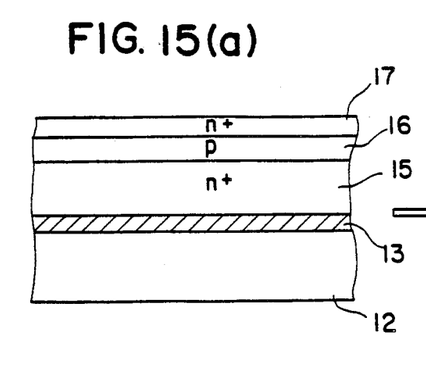
FIG. 15(a) is a cross-sectional view of the initial substrate used therefor.
Figure 15B:
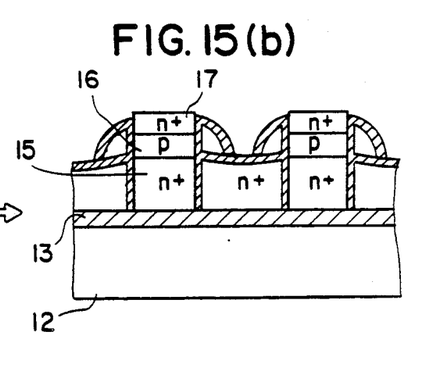
FIG. 15(b) is a schematic cross-sectional view of a second preferred embodiment of the present invention.

In a second preferred embodiment, the cell structure shown in FIG. 15(b) may be used, wherein the p− layer 14 is eliminated from the structure of the previous embodiment. This structure is fabricated utilizing the substrate shown in FIG. 15(a), the substrate being formed by controlling the thickness of the n+ epitaxial layer 15 and the depth of the boron ion implantation after polishing and lapping process of p⁻ layer 14 explained in FIGS. 4(b), 5, and 6. The structure has an advantage such that a comparatively larger capacitance can be obtained than that of the previous embodiment with the same surface area of each cell. However, this type is easily influenced by fluctuation of the channel length.

Figure 16A:
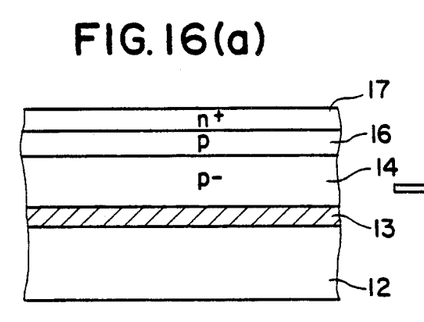
FIG. 16(a) is a cross-sectional view of the initial substrate used therefor.
Figure 16B:
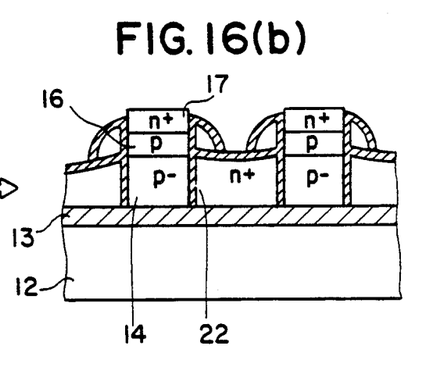
FIG. 16(b) is a cross-sectional view of a third preferred embodiment of the present invention.

In a third embodiment, the cell structure shown in FIG. 16(b) may be used which is fabricated utilizing the substrate shown in FIG. 16(a), wherein the process of forming the n+ epitaxial layer 15 is omitted from the previous embodiment. The p⁻ layer 14 functions as a storage electrode, and an inversion layer is formed on an inside surface of the dielectric film 22. The channel length can be determined easily at a fixed value, and fluctuation of a threshold voltage Vth of the MOS FET is comparatively small.

Figure 17:
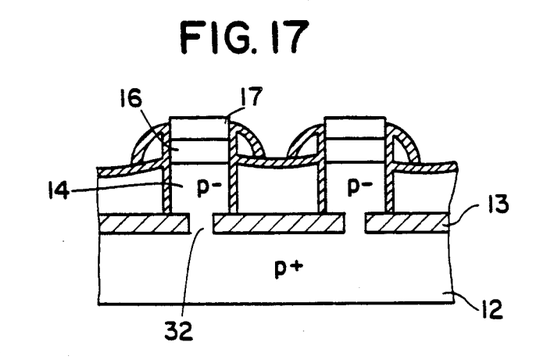
FIG. 17 is a cross-sectional view of a fourth, preferred embodiment of the present invention.

A fourth embodiment shown in FIG. 17 is a modification of the structure shown in FIG. 16(b). The p⁻ layer 14, which functions as a storage electrode, is further connected to the substrate 12 through a hole 32 formed in the insulating layer 13. This type of cell structure is used in such a way that the substrate 12 is grounded during operation in order to avoid a potential fluctuation of the p⁻ layer 14. Therefore, this type has a stronger resistance to noises. As a result, the DRAM device of this type has greater reliability than that of a DRAM device which has the same cell capacitance.

The present invention may be embodied in other specific forms without departing from the spirit or essential characteristics thereof. The presently disclosed embodiment and modifications are therefore to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. A semiconductor memory device having a memory cell including a transistor stacked on a capacitor thereof, a word line and a bit line, said semiconductor memory device comprising:

(a) a first insulating layer formable on a semiconductor substrate;
   (b) a plurality of semiconductor pillar structures formed on said first insulating layer and being arranged in a matrix array and isolated from each other by a trench extending to said first insulating layer, each said pillar structure having a first semiconductor layer of a first conductivity type formed on said first insulating layer and forming a storage electrode of said capacitor, a second semiconductor layer of a second conductivity type opposite to the first conductivity type formed on said first semiconductor layer, and a third semiconductor layer of the first conductivity type formed on said second semiconductor layer, and said transistor being formed in an upper portion of each pillar structure, each said pillar structure having side surfaces;
   (c) second insulating layer formed on the side surfaces of each said pillar structure and having first and second regions, the first region being an insulating layer of said capacitor and the second region a gate insulating layer of said transistor;
   (d) a first conductive layer forming a cell plate of said capacitor and being formed in said trench and on said first insulating layer, said first conductive layer having substantially the same thickness as the first semiconductor layer of said pillar structure and sandwiching the first region of said second insulating layer with said first semiconductor layer;
   (e) a third insulating layer formed on said first conductive layer;
   (f) a second conductive layer formed over said third insulating layer and the second region of said insulating layer, said second conductive layer surrounding at least a portion of said second semiconductor layer of said pillar structure and forming a gate electrode of said transistor, separated from adjacent second conductive layers in a first direction and connected with adjacent second conductive layers in a second direction different from the first direction so as to form said word line;
   (g) a third conductive layer formed on said third semiconductor layer and connected with adjacent third semiconductor layers of said pillar structure along the first direction so as to form said bit line; and wherein said second semiconductor layer of the second conductivity type includes a lower second semiconductor layer having an impurity concentration and an upper second semiconductor layer having a relatively high impurity concentration compared to the lower second semiconductor layer.

2. A semiconductor memory device having a memory cell according to claim 1, wherein the impurity concentration of the lower second semiconductor layer is about one tenth that of the upper second semiconductor layer.

3. A semiconductor memory device having a memory cell according to claim 1, wherein a surface level of said first conductive layer is within a height range of the lower second semiconductor layer of said second semiconductor layer.

4. A semiconductor memory device having a memory cell according to claim 1, wherein said plurality of semiconductor pillar structures are arranged in the matrix array with a gap formed between adjacent pillar structures in a first direction being of greater distance than a gap formed between adjacent pillar structures in a second direction.

5. A semiconductor memory device having a memory cell according to claim 1, wherein said second conductive layer is made of doped polysilicon and has a curved surface and a thickness that decreases with increasing height.

6. A semiconductor memory device having a memory cell including a transistor stacked on a capacitor thereof, a word line and a bit line, said semiconductor memory device comprising:

(a) a first insulating layer formable on a semiconductor substrate;
   (b) a plurality of semiconductor pillar structures formed on said first insulating layer and being arranged in a matrix array and isolated by a trench extending to said first insulating layer, each said pillar structure having a first semiconductor layer of a first conductivity type of a relatively low impurity concentration formed on said first insulating layer, a second semiconductor layer of the first conductivity type of a high impurity concentration relative to the first semiconductor layer and being formed on said first semiconductor layer, and a third semiconductor layer of a second conductivity type formed on said second semiconductor layer, and said transistor being formed in an upper portion of each pillar structure and said capacitor being formed in a lower portion of each pillar structure, each said pillar structure having side surfaces;

(c) a second insulating layer formed over the side surfaces of said pillar structure and having first and second regions, the first region being an insulating layer of said capacitor and the second region being a gate insulating layer of said transistor;

(d) a first conductive layer forming a cell plate of said capacitor and being formed in said trench and on said first insulating layer, said first conductive layer having substantially the same thickness as the first semiconductor layer of said pillar structure and sandwiching the first region of said second insulating layer with said first semiconductor layer;

(e) a third insulating layer formed on said first conductive layer;

(f) a second conductive layer formed over said third insulating layer and the second region of said second insulating layer, said second conductive layer surrounding said second semiconductor layer of each said pillar structure and forming a gate electrode of said transistor, separated from adjacent second conductive layers in a first direction and connected with adjacent second conductive layers in a second direction different from the first direction, so as to form said word line; and (g) a third conductive layer formed on said third semiconductor layer and connected with adjacent third semiconductor layers of said pillar structure along the first direction so as to form said bit line.

7. A semiconductor memory device having a memory cell according to claim 6, wherein said semiconductor substrate is of the first conductivity type and a hole is formed in said first insulating layer under each said pillar structure and said first semiconductor layer contacts the substrate through said hole.

8. A semiconductor memory device having a memory cell according to claim 6, wherein said plurality of semiconductor pillar structures are arranged in the matrix array with a gap formed between adjacent pillar structures in a first direction being of greater distance than a gap formed between adjacent pillar structures in a second direction.

9. A semiconductor memory device having a memory cell according to claim 6, wherein said second conductive layer is made of doped polysilicon and has a curved surface and a thickness that decreases with increasing height.

* * * * *